United States Patent [19]

Senba

[11] Patent Number: 5,216,756
[45] Date of Patent: Jun. 1, 1993

[54] LUMINANCE INTERSPERSION TYPE WAVEFORM DISPLAY APPARATUS

[75] Inventor: Masato Senba, Sayama, Japan

[73] Assignee: Nihon Kohden Corporation, Tokyo, Japan

[21] Appl. No.: 589,450

[22] Filed: Sep. 27, 1990

[30] Foreign Application Priority Data

Sep. 29, 1989 [JP] Japan ................... 1-254973
Sep. 29, 1989 [JP] Japan ................... 1-254974

[51] Int. Cl.$^5$ ............................... G06F 3/14
[52] U.S. Cl. ........................ 395/140; 395/132
[58] Field of Search ............ 395/132, 140, 141, 142, 395/143, 164; 360/36.2; 340/720, 723, 724, 728, 740, 744, 749, 732; 358/154, 156, 315

[56] References Cited

U.S. PATENT DOCUMENTS

| | | | |
|---|---|---|---|
| 3,812,491 | 5/1974 | Barraclough et al. | 340/324 |
| 3,902,476 | 9/1975 | Hileman | 128/2 |
| 4,733,294 | 3/1988 | Wesolowski | 360/36.2 |
| 5,043,923 | 8/1991 | Joy et al. | 395/164 |

OTHER PUBLICATIONS

William M. Newman, "Principal of Interactive Computer Graphics", 2nd Edition, 1979, pp. 102, 254, 280, 281.

Primary Examiner—Gary V. Harkcom
Assistant Examiner—Huynh Ba
Attorney, Agent, or Firm—Hoffmann & Baron

[57] ABSTRACT

A luminance interspersion type waveform display apparatus arranged in such a manner that a supplied waveform signal is successively sampled and amplitude data of each time-base address corresponding to a display frame is stored by a memory. The serial dot data processor successively reads the amplitude data of the adjacent time-base address from the memory. The serial dot data processor connects the amplitude data items so as to linearly intersperse the luminance in synchronization with a clock. The apparatus contains a bit map memory having two or more regions which can be shifted and written in each amplitude address of the respective time-base address in synchronization with the clock input. The two or more regions are capable of being simultaneously set to a reading mode and a writing mode. These modes are alternately switched so that when the serial dot data is written in one region in a direction perpendicular to the direction of the time-base address, another region is read in the direction of the time-base address and the waveform is displayed on a waveform display apparatus by raster scanning.

6 Claims, 4 Drawing Sheets

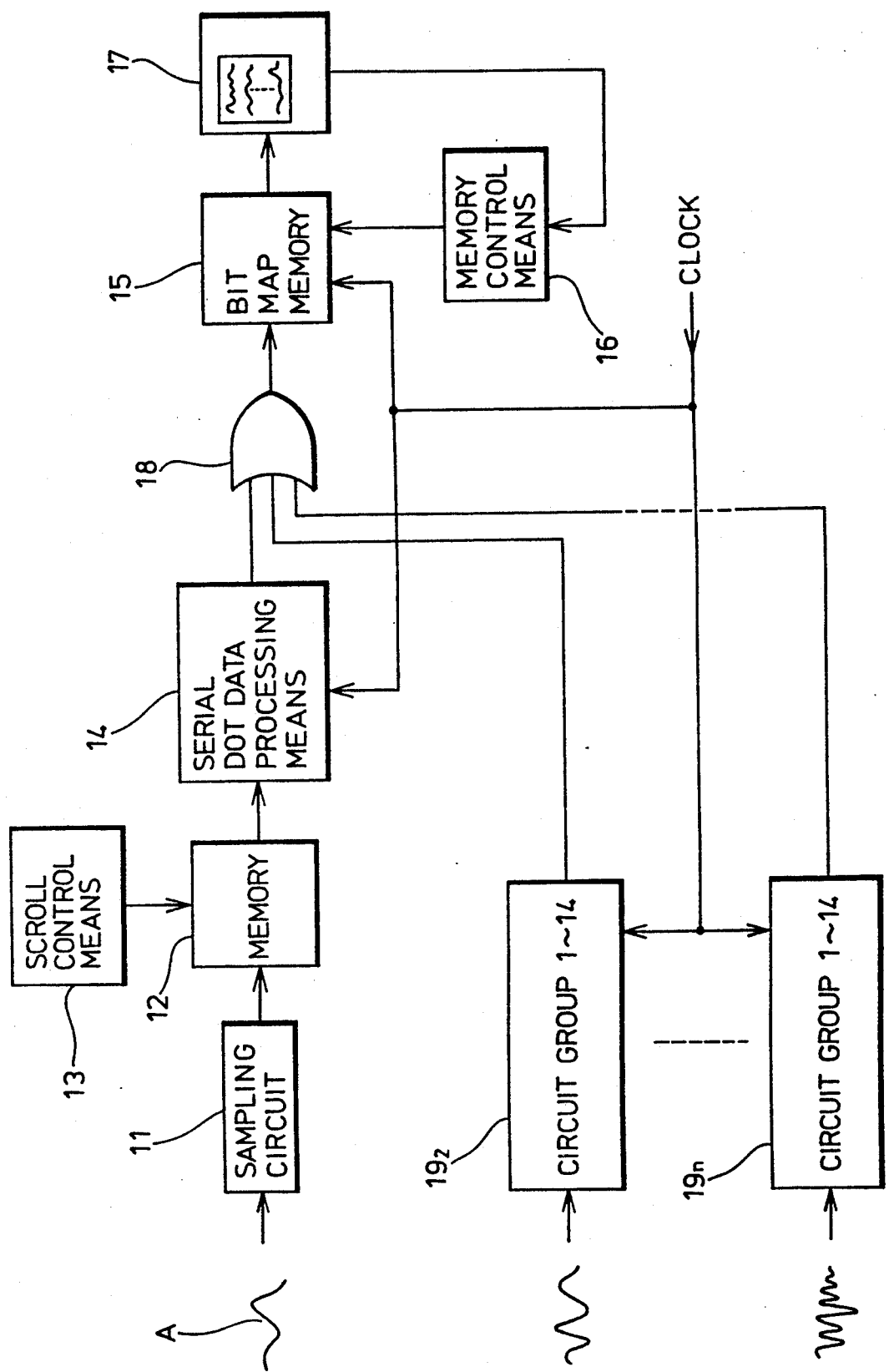

LUMINANCE INTERSPERSION TYPE WAVEFORM DISPLAY APPARATUS

BACKGROUND OF THE INVENTION

1. Field Of The Invention

The present invention relates to a luminance interspersion type waveform display apparatus which successively samples a supplied waveform signal so as to store it in a memory. The apparatus connects between the sampling data items of the neighboring time-base addresses with a dot for linear luminance interspersion so as to store it in a bit memory. The apparatus then reads the memory in the direction of the time-base address by raster scanning so that the waveform of a dot pattern is displayed.

2. Description of the Prior Art

A luminance interspersion method which performs real time processing by using a hard logic circuit for the purpose of successively sampling a supplied waveform and linearly interspering the sampling dot data items of the neighboring time-base addresses has been disclosed in U.S. Pat. Nos. 3,902,476 and 3,812,491.

A conventional waveform display apparatus of the type described above is arranged in such a manner that the input waveform signal is successively sampled so as to store it in a memory. Then the stored waveform data is connected by dots for realizing a linear luminance interspersion and the waveform is displayed after transmission to a bit map memory to be read in response to raster scanning. According to the conventional apparatus, the luminance interpolation data is processed by an operation of a CPU so as to be temporarily stored in an exclusive memory. Then, the corresponding address in the bit map memory is addressed so that it is transmitted.

According to the above conventional apparatus, the reading of the bit map memory is restricted by a scrolling function where the display position is shifted from a normal position in the direction of the time base to the newly sampled waveform portion which is displayed in the reverse direction of the time-base.

As a result, circuit processing in the conventional device is too complicated and completion of the processing has taken an excessively long time. Furthermore, when waveforms of a plurality of channels are displayed, the structure of the circuit becomes extremely complicated if the scrolling is not performed common to all of the channels.

OBJECTS AND SUMMARY OF THE INVENTION

Accordingly, an object of the present invention is to provide a luminance interspersion type waveform display apparatus in which the luminance of a supplied waveform signal is temporarily stored in a memory and can be interspersed by a simple circuit structure and the interspersed data can be easily written in a bit map memory.

A second object of the present invention is to provide a luminance interpolation type waveform display apparatus having a scrolling function in which the luminance of a supplied waveform signal is temporarily stored in memory. The waveform signal can then be linearly interspersed between the neighboring dot data items by a simple circuit structure and the interspersed data can be easily written in a bit map memory.

A further object of the present invention is to provide a luminance interspersion type waveform display apparatus having a scrolling function which enables a plurality of waveform channels to be displayed to easily perform the individual scrolling operation.

According to the present invention, (a) A supplied waveform signal is successively sampled and amplitude data of each time-base address corresponding to a display frame is stored in memory.

(b) Serial dot data for connecting the amplitude data with dot data so as to linearly intersperse the luminance in synchronization with clocks is processed by successively reading the amplitude data of the neighboring time-base address of the memory.

(c) A bit map memory is designed so as to have two or more regions which can be simultaneously set and alternatively switched to a reading and writing mode. Furthermore, the serial dot data is written in each amplitude address of the time-base address in a region which has been set to the writing mode in synchronization with the clock.

(d) The region of the bit map memory set to the reading mode is successively read in the direction of the time-base address and the waveform is displayed by raster scanning.

The scrolling is performed by controlling the scroll of the reading address portion of the memory which stores the sampling data. In the case of plural channels, the serial dot data for each of the channels is supplied to the bit map memory via a logical sum means.

According to the present invention, serial dot data which linearly intersperses the luminance between the sampling points for the supplied waveform can be processed in a simple hardware circuit without using a microprocessor. Then the serial dot data can be written on the bit map memory in synchronization with the clock. Therefore, the processing and writing of the serial dot data can be easily and quickly performed. In the case where a plurality of channels are displayed, the individual scrolling can be performed significantly easier in comparison to the control of reading the bit map memory.

Further objects, features and advantages of the invention will be apparent from the following detailed description taken in conjunction with the accompanying drawings showing a preferred embodiment of the apparatus for luminance interspersion type waveform display.

BRIEF DESCRIPTION OF THE DRAWINGS

FIG. 3 illustrates the structure of a luminance interspersion type waveform display apparatus having a scrolling function according to an embodiment of the present invention;

DETAILED DESCRIPTION OF THE PREFERRED EMBODIMENTS

Figure 1:
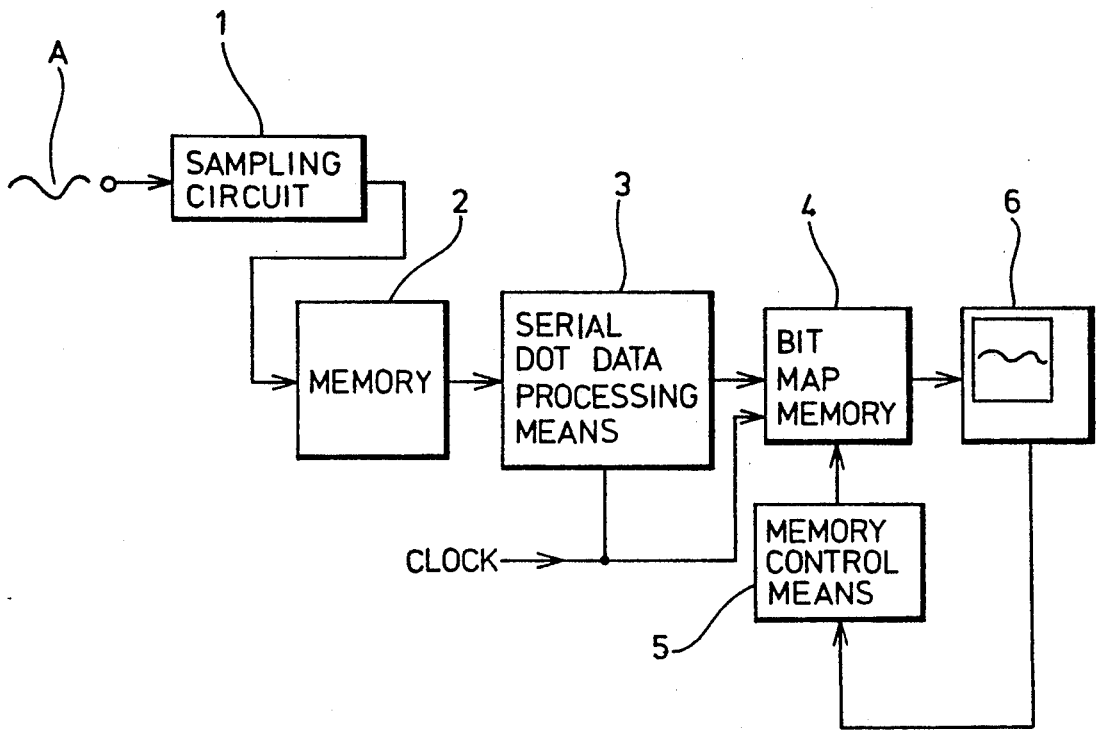
FIG. 1 illustrates the structure of an embodiment of a luminance interspersion type waveform display apparatus according to the present invention.

FIG. 1 illustrates the structure of an embodiment of a luminance interpolation type waveform display apparatus according to the present invention.

Referring to FIG. 1, reference numeral 2 represents a memory for storing amplitude data with respect to the time-base address which corresponds to the display frame after successive sampling of an input waveform signal by a sampling circuit 1.

Reference numeral 3 represents a serial dot data processing means for successively processing serial dot data corresponding to a predetermined number of amplitude addresses in a direction perpendicular to the direction of the time-base address on the display frame. The above processing is performed for each of the time-base addresses in synchronization with the clock. The serial dot data processing means 3 connects the amplitude data items so as to linearly intersperse the luminance by successively reading the amplitude data in the neighboring time-base addresses of the memory 2.

Reference numeral 4 represents a bit map memory corresponding to the display frame and having at least two regions in which serial dot data can be shifted and written in each amplitude address of the respective time-base address in synchronization with the clock input. The two or more regions are capable of being simultaneously set to a reading and writing mode. A memory of the type described above in which binary data can be shifted and written in a direction perpendicular to the reading direction whenever the clock signal is supplied is known technology.

Reference numeral 5 represents a memory control means for setting either of the two above-described regions to the reading mode, setting another region to the writing mode, and then switching the above-described modes.

Reference numeral 6 represents a waveform display apparatus for successively reading the bit map memory in the direction of the time-base address and displaying the read data on the display frame by performing raster scanning.

The operation of the apparatus of the present invention shown in FIG. 1 will now be described.

Figure 2A:
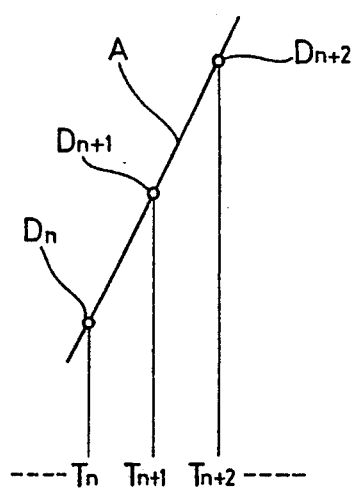
FIGS. 2A-2C illustrate the operation of the embodiment of the present invention.
Figure 2B:
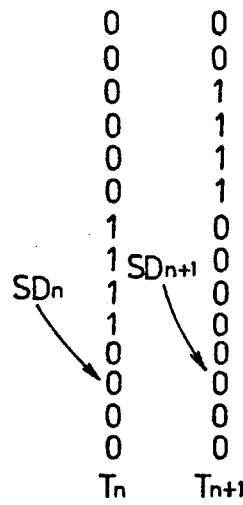

As shown in FIG. 2, amplitude data, $D_n$, $D_{n+1}$, $D_{n+2}$, ... (see FIG. 2A) with respect to time-base addresses, $T_n$, $T_{n+1}$, $T_{n+2}$, ... is sampled by the sampling circuit 1 in response to input waveform signal A and is successively stored by the memory 2. The serial dot data processing means 3 successively processes serial dot data, $SD_n$, $SD_{n+1}$, ..., (see FIG. 2B) with respect to the time-base addresses, $T_n$, $T_{n+1}$, $T_{n+2}$, ..., on the basis of amplitude data, $D_n$, $D_{n+1}$, $D_{n+2}$, ..., of the neighboring time-base addresses in synchronization with the clock. Then, the memory control means 5 has either of the regions of the bit map memory 4 read in the direction of the time-base address corresponding to the raster scanning operation. Simultaneously, the memory control means 5 successively writes, in synchronization with the clock, to each amplitude address of another region in a perpendicular direction. After reading and writing to each of the regions has been completed, writing and reading are, alternatively performed by the memory control means 5.

Figure 2C:
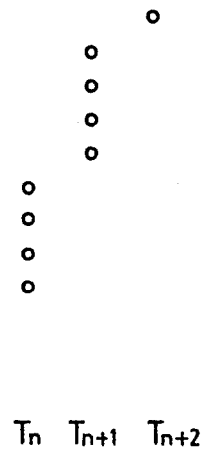

As a result as shown in FIG. 2C, the waveform of a dot pattern, the luminance of which has been linearly interspersed, is displayed by the raster scanning operation.

FIG. 3 illustrates the structure of the embodiment of the waveform display apparatus having a scroll function.

Reference numeral 12 represents a memory for storing sampling signals of the supplied waveform which have been successively sampled by sampling circuit 11. The sampling signals are stored as the amplitude data of each time-base address corresponding to the display frame Reference numeral 13 represents a scroll control means for setting a start address when the amplitude data for one display frame is read from memory 12 for the purpose of performing the scroll action on the display frame.

Reference numeral 14 represents a serial dot data processing means for successively processing serial dot data corresponding to a predetermined number of amplitude addresses in a direction perpendicular to the direction of the time-base address on the display frame. The above processing is performed in synchronization with the clock for each time-base address. The serial dot data processing means 14 connects the amplitude data items to linearly intersperse the luminance by successively reading the amplitude data in the neighboring time-base addresses of the memory.

Reference numeral 15 represents a bit map memory which corresponds to the display frame. The bit map memory has two or more regions to which serial dot data can be shifted and written in each amplitude address of the respective time-base address in synchronization with the clock input. The two or more regions are capable of being simultaneously set to a reading and writing mode. A memory of the type described above to which binary data can be shifted and written in a direction perpendicular to the reading direction whenever the clock is supplied thereto is a known technology.

Reference numeral 16 represents a memory control means for setting either of the two above-described regions to the reading mode, setting the other region to the writing mode, and then switching the above-described modes.

Reference numeral 17 represents a waveform display apparatus for successively reading the bit map memory in the direction of the time-base address and displaying the dot data on the display frame by performing raster scanning.

Reference numeral 18 represents a logical sum means for supplying serial dot data transmitted from each circuit portion $19_1$ to $19_n$ to the bit map memory 15. Circuit portion $19_1$, to $19_n$ represents of a plurality of channels encompassing the above-described circuit groups 11 to 14.

The operation of the apparatus shown in FIG. 3 will now be described.

Amplitude data, $D_n$, $D_{n+1}$, $D_{n+2}$, ... (see FIG. 2A) with respect to time-base addresses, $T_n$, $T_{n+1}$, $T_{n+2}$, ... is sampled by sampling circuit 11 in response to the input waveform signal A and is successively stored by the memory 12. The one display frame of the memory 12 is started from the start address set by the scroll control means 13. As a result, the serial dot data processing means 14 successively processes serial dot data, $SD_n$, $SD_{n+1}$, ..., (see FIG. 2B) with respect to the time-base addresses, $T_n$, $T_{n+1}$, $T_{n+2}$, ..., on the basis of amplitude data, $D_n$, $D_{n+1}$, $D_{n+2}$, ..., of the neighboring time-base addresses in synchronization with the clock. The memory control means 16 has either of the written regions of the bit map memory 15 read in the direction of the time-base address corresponding to the raster scanning operation. Simultaneously, the memory control means 16 successively writes to each amplitude address of another region in a perpendicular direction in synchronization with the clock. After reading and writing to each of the regions has been completed, writing and reading are alternatively performed. As shown in FIG. 2C, the waveform of a dot pattern, the luminance of which has been linearly interpolated, is displayed by the raster scanning operation of the display apparatus 17.

In the case of plural channels, a plurality of serial dot data items scrolled in response to the setting action performed by the individual scroll control means in the circuit portions $19_2$ to $19_n$ are synthesized by the logical sum means 18 so as to be supplied to the bit map memory 15.

Figure 4:
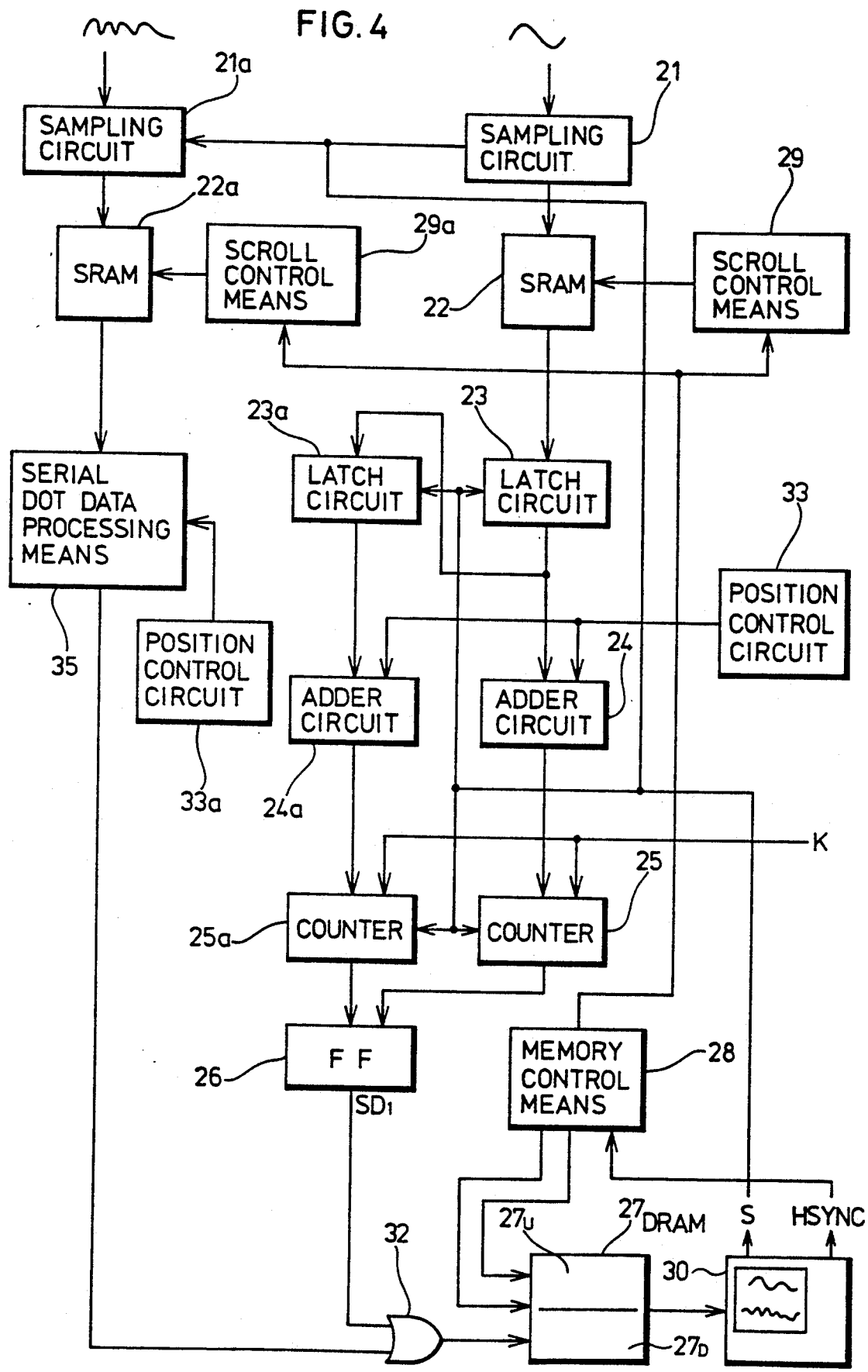
FIG. 4 further specifically illustrates the apparatus according to an embodiment of the present invention.
Figure 5:
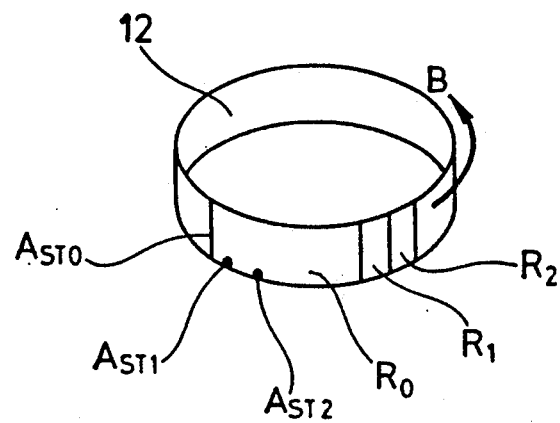
FIGS. 5 and 6A-6C respectively illustrate the operation of the structure shown in FIG. 4.

FIG. 4 illustrates the structure of a circuit for use in a 2-channel waveform display apparatus having a scroll function according to the present invention.

Referring to FIG. 4, reference numeral 21 represents a 1st-channel sampling circuit for holding a supplied waveform signal A by successively sampling it in synchronization with the time-base address stepping signal S. Reference numeral 22 represents a static RAM the capacity of which corresponds to, for example, two display frames of a CRT display apparatus 30. The static RAM 22 acts to successively circulate the sampling signal through the storage region as amplitude data.

Reference numeral 23 represents a latch circuit for successively latching the amplitude data in each time-base address read from the SRAM 22 in synchronization with the time-base address stepping signal S. Reference numeral 23a represents another latch circuit for successively latching the amplitude data latched by circuit 23 with a delay corresponding to one cycle of the time-base address stepping signal S. Reference numerals 24 and 24a represent adder circuits. The adder circuits receive the vertical position on the display frame which is set in the position control circuit 33 due to an external operation so as to add it to the latched value received from the respective latch circuits 23 and 23a. As a result, the display position of the waveform can be vertically adjusted. Reference numeral 25 represents a counter which successively counts clock K having a higher frequency than that of the time-base address stepping signal S. Counter 25 then transmits a coincidence signal when the counted value coincides with the preset sum of the adder circuit 24. Reference numeral 25a is another counter which performs a similar operation and to which the sum of the adder circuit 24a is preset. Reference numeral 26 represents a flip-flop circuit which is set or reset in response to a coincidence signal transmitted from the counters 25 and 25a. The flip-flop circuit 26 changes serial dot data $SD_1$ from "0" to "1" during the supply of the coincidence signal.

Reference numeral 27 represents a group of multiport dynamic RAMs (for example, part no. HM53461-12 manufactured by Hitachi Corporation) which serve as a bit map memory. The serial dot data can be written to the DRAM by a shifting operation in a direction perpendicular to the reading direction by the clock. The DRAM 27 is sectioned into an upper region $27_U$ (constituted by a single or a plurality of regions depending upon the memory capacity) and a lower region $27_D$ (similarly constituted by a single or a plurality of regions). At intermediate address $A_M$ of the amplitude address, each DRAM 27 region can be individually set to the writing mode and the reading mode.

Reference numeral 28 represents a memory control circuit to which a horizontal synchronizing signal HSYNC is transmitted from the CRT display apparatus 30. The memory control circuit 28 alternately sets the upper region $27_U$ and the lower region $27_D$ of the DRAM 27 to the reading mode and the writing mode in each raster scanning time period for one half display frame.

Reference numeral 29 represents a scroll control means. The scroll control means 29 enables a successive writing in regions $R_1, R_2, \ldots$, of the time-base direction B for sampling each display frame next to region $R_0$ which corresponds to one display frame to be performed. Furthermore, it causes the written region $R_0$ of the SRAM 22 to be read twice for each display frame performed during the raster scanning period In the scroll moving mode, the reading start address is circularly shifted in the sequential order of $A_{ST0}, A_{ST1}, A_{ST2}, \ldots$, in the time-base direction B by the number of addresses for the novel sampling. Furthermore, it shifts the start address by a large or small number of addresses in response to the external operation. Alternatively, it shifts the start address in the time-base direction B without performing writing for the novel sampling.

The CRT display apparatus 30 reads the read mode region of the DRAM 27 in the time-base address direction and displays the waveform by the raster scanning operation.

Reference numeral 21a represents a sampling circuit for sampling a 2nd-channel input signal to which the SRAM 22a, the scroll control means 29a, a position control circuit 33a and a serial dot data processing means 35, constituting the above-described elements 23 to 26 and 23a to 25a, are successively connected. Reference numeral 32 represents an OR gate to which serial dot data $SD_1$ and $SD_2$ of both channels are supplied.

The operation of the CRT waveform display apparatus will now be described.

The input waveform signal A sampled by the sampling circuit 21 is successively stored in the cycling direction at the end portion of the region $R_0$ of the SRAM which has been read twice. The memory control means 28 sets, for example, the upper region $27_U$ to the reading mode and sets the lower region $27_D$ to the writing mode. Furthermore, the memory control means 28 causes the scroll control means 29 to read the written region $R_0$ of the SRAM 22 for one display frame at twice the speed that the DRAM 27 is read. The latch circuits 23 and 23a successively latch the amplitude data of the neighboring time-base address and the vertical position of the display frame is added to the latched value by the adder circuit. As a result, the flip-flop circuit 26 transmits the serial dot data $SD_1$ which causes the region between the coincidence signals corresponding to both neighboring dot data the position of which has been adjusted to be "1". During the period in which the upper region $27_U$ is being subjected to scanning, the serial dot data $SD_1$ is written to the lower region $27_D$ at high speed in one cycle of the time-base address stepping signal S while successively stepping the amplitude address in response to clock K for each time-base address. When the writing of the time-base address to the intermediate address AM has been completed, the same stored content is again read from the region $R_0$ of the SRAM 22 so as to perform writing to the upper region $27_U$ and to perform reading from the lower region $27_D$.

Figure 6A:
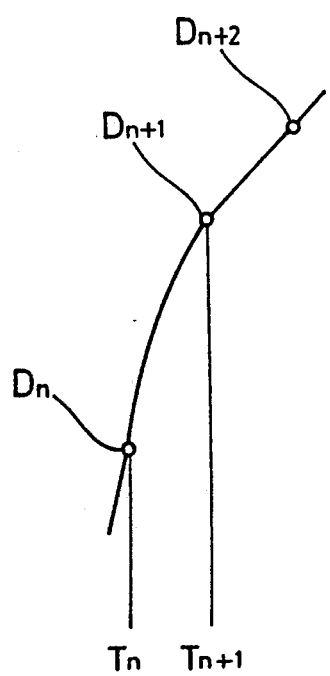
Figure 6B:
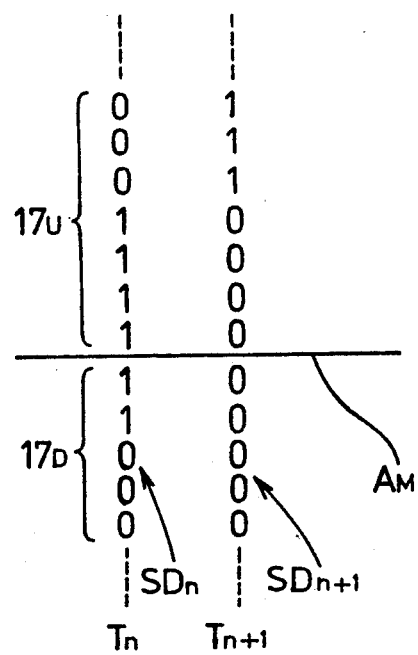
Figure 6C:
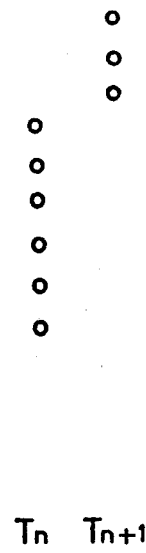

For example, referring to FIG. 6, when the data, $D_n$ and $D_{n+1}, \ldots$, (see FIG. 6A) of the time-base address, $T_n$ and $T_{n+1}, \ldots$, vertically intersects the intermediate address $A_M$ and the serial dot data, $SD_n$, $SD_{n+1}, \ldots$, the intermediate address $A_M$ is, as shown in FIG. 6B, written to the lower region $27_D$ until the upper region $27_U$ is brought to the reading mode. No writing to the upper region $27_U$ is made if the serial dot data is generated since it is in the reading mode. If the serial dot data, $SD_{1n}$, $SD_{1n+1}, \ldots$, is generated again, no writing is made to the intermediate address $A_M$ until the lower region is brought to the reading mode. However, writing to the upper region $27_U$ is performed. As described above, the upper region $27_U$ and the lower region $27_D$ are alternately brought to the writing mode and the reading mode. As a result, the CRT display apparatus 30 displays the waveform data of the region between neighboring dot data items which have been sampled and is subjected to the linear luminance interpolation.

Similarly, the serial dot data $SD_2$ supplied from the 2nd-channel serial dot data generating means 35 is synthesized through the OR gate 32. Therefore, it is written to each of the time-base addresses simultaneously with the writing of the 1st-channel data $SD_1$ so it can be displayed in an overlapped manner. In the case where no scrolling is performed, the scroll control means 29 and 29a respectively and individually transmit the start address position and the address shifting interval of each which have been set in response to an external operation. For example, in the case where an electrocardiogram signal has been supplied to channel 1 and a respiratory sound signal has been supplied to channel 2, both waveforms can be displayed in a matched reading. This is accomplished by setting the electrocardiogram signal to the moving mode and setting the respiratory sound signal so that the scrolling is arranged such that the address shifting interval between the start addresses is lengthened in response to the respiratory wave.

According to the above-described embodiment, in the case where the bit map memories are prepared for two display frames, the capacity of each corresponding to one CRT display frame, another structure may be employed which is arranged so that the memory control circuit alternately sets both bit map memories to the reading and the writing modes. Furthermore, writing of the serial dot data is performed from address zero to the maximum of the amplitude address for each time-base address at the time of the writing operation. In this case, the speed of reading the SRAM can be made to be the same as the reading speed of the bit map memory instead of twice the speed.

Although illustrative embodiments of the present invention have been described herein with reference to the accompanying drawings, it is to be understood that the invention is not limited to those precise embodiments and that various other changes and modifications may be effected therein by one skilled in the art without departing from the scope or spirit of the invention.

What is claimed is:

1. A luminance interspersion type waveform display apparatus comprising:

means for successively sampling a supplied waveform signal and providing amplitude data corresponding thereto;

a memory for storing the amplitude data of each of a plurality of time-base addresses which correspond to a display frame;

serial dot data processing means for successively processing serial dot data corresponding to a predetermined number of amplitude addresses in a direction perpendicular to the direction of said time-base address on said display frame, said processing being performed for each of said time-base addresses in synchronization with a clock so that said amplitude data items are connected so as to linearly intersperse the luminance by successively reading said amplitude data in a next time-base addresses of said memory;

a bit map memory corresponding to said display frame and having at least two regions to which serial dot data can be, with shifting, written in each of said amplitude addresses of said respective time-base address in synchronization with the clock input, said at least two regions being adapted to be simultaneously set to a reading mode and a writing mode, the writing to a first of the two regions of the bit map memory occurring in a direction perpendicular to the direction of reading of a second of the at least two regions of the bit map memory;

memory control means for setting one of said two regions to said reading mode, setting the other of said two regions to said writing mode and switching the above-described modes; and a waveform display apparatus for successively reading the bit map memory in the direction of said time-base address and displaying said read data on said display frame by performing raster scanning.

2. A luminance interspersion type waveform display apparatus according to claim 1, wherein said serial dot data processing means includes: a first latch circuit for successively reading and latching said amplitude data in each of said time-base addresses of said memory for storing said amplitude data in synchronization with a time-base address stepping signal; a second latch circuit for successively latching said amplitude data latched by said first latch circuit by delaying said amplitude data from said time-base address stepping signal by one cycle; a first counter for successively counting clocks having a frequency higher than that of said time-base address stepping signal and transmitting a first coincidence signal when said counted value coincides with a preset value latched in said first latch circuit; a second counter for similarly counting clocks having a frequency higher than that of said time-base address stepping signal and transmitting a second coincidence signal when said counted value coincides with a preset value corresponding to a latched value in said second latch circuit; and a flip-flop circuit which is set or reset in response to said first and second coincidence signals transmitted from said first and second counters and reversing binary data of said serial dot data in a period between one of said coincidence signals and the other of said coincidence signals.

3. A luminance interspersion type waveform display apparatus according to claim 1, wherein said bit map memory is vertically sectioned into two sections at the intermediate address of said amplitude address in said amplitude direction and having an upper region and a lower region which can be individually set to a writing mode and a reading mode, said writing being performed at a speed which is two times the reading speed.

4. A luminance interspersion type waveform display apparatus according claim 1, wherein said bit map memory, each corresponding to one display frame, is prepared by a capacity for two display frames and said writing is performed at a speed which is two times the reading speed.

5. A luminance interspersion type waveform display apparatus according to claim 1, further comprising a scroll control means for setting a start address for reading said amplitude data for said display frames from said memory which stores a sampling signal of said supplied waveform signal as said amplitude data for each of said time-base addresses corresponding to said display frame for the purpose of performing scrolling.

6. A waveform display apparatus having a scrolling function comprising:
- means for successively sampling a supplied waveform signal and providing amplitude data corresponding thereto;
- a memory for storing the amplitude data of each of a plurality of time-base addresses which correspond to a display frame;
- scroll control means for setting a start address for reading said memory for the purposes of performing scrolling on said display frame;
- serial dot data processing means for successively processing serial dot data corresponding to a predetermined number of amplitude addresses in a direction perpendicular to the direction of said time-base address on said display frame, said processing being performed for each of said time-base addresses in synchronization with a clock so that said amplitude data items are connected so as to linearly intersperse the luminance by successively reading said amplitude data in a next time-base addresses of said memory, said scroll control means and said serial dot data processing means being provided for a plurality of channels;
- a bit map memory corresponding to said display frame and having at least two regions to which serial dot data transmitted from said logical sum means is adapted to be, with shifting written in each of said amplitude addresses of said respective time-base address in synchronization with the clock, said at least two regions being adapted to be simultaneously set to a reading mode and a writing mode, the writing to a first of the two regions of the bit map memory occurring in a direction perpendicular to the direction of reading of a second of the at least two regions of the bit map memory;
- memory control means for setting one of said at least two regions to said reading mode, setting the other of said at least two regions to said writing mode and switching the above-described modes; and
- a raster scanning type display apparatus for successively reading said bit map memory in the direction of said time-base address and displaying said read data on the said display frame by performing a raster scanning.

* * * * *

UNITED STATES PATENT AND TRADEMARK OFFICE
CERTIFICATE OF CORRECTION

PATENT NO. : 5,216,756
DATED : June 1, 1993
INVENTOR(S) : Masato Senba

It is certified that error appears in the above-indentified patent and that said Letters Patent is hereby corrected as shown below:

Column 1, line 33, delete "interpolation", and insert --interspersion --.

Column 4, line 11, after "frame", insert --.--.

Column 6, line 21, after "period", insert --.--

Column 6, line 68, delete "AM", and insert --$A_M$--.

Column 9, line 24, delete "purposes", and insert --purpose--.

Signed and Sealed this

Eighth Day of February, 1994

Attest:

BRUCE LEHMAN

Attesting Officer

Commissioner of Patents and Trademarks